United States Patent [19]

Fossaceca et al.

[11] Patent Number: 5,864,750
[45] Date of Patent: Jan. 26, 1999

[54] MICROCOMPUTER-BASED CARRIER DETECTION SYSTEM FOR A CORDLESS TELEPHONE BY COMPARING AN OUTPUT SIGNAL WHICH CONTAINS SIGNALS NO HIGHER IN FREQUENCY WITH A FREQUENCY THRESHOLD VALUE

[75] Inventors: John Mark Fossaceca, Baldwinville; Dennis Ronald McCarthy, Syracuse, both of N.Y.

[73] Assignee: Thomson Consumer Electronics, Inc., Indianapolis, Ind.

[21] Appl. No.: 998,938

[22] Filed: Oct. 23, 1997

Related U.S. Application Data

[63] Continuation of Ser. No. 616,041, Mar. 11, 1996, abandoned, which is a continuation of Ser. No. 171,353, Dec. 21, 1993, abandoned.

[51] Int. Cl.[6] ........................................................ H04Q 7/32
[52] U.S. Cl. ........................ 455/144; 455/183.1; 455/266; 455/307
[58] Field of Search ...................... 455/307, 340, 455/350, 144, 188.1, 214, 266, 324, 334, 328, 317, 183.1

[56] References Cited

U.S. PATENT DOCUMENTS

| | | |
|---|---|---|
| 3,437,937 | 4/1969 | Warfield . |
| 3,633,112 | 1/1972 | Anderson . |
| 3,902,123 | 8/1975 | Oomen . |
| 5,031,233 | 7/1991 | Ragar ....................................... 455/307 |
| 5,095,534 | 3/1992 | Hiyama .................................. 455/266 |
| 5,101,509 | 3/1992 | Lai ......................................... 455/183 |
| 5,349,701 | 9/1994 | Lobel ..................................... 455/222 |
| 5,715,282 | 2/1998 | Mansouri et al. ...................... 455/307 |
| 5,732,337 | 3/1998 | Wargnier et al. ....................... 455/144 |

FOREIGN PATENT DOCUMENTS 2217150  10/1989   United Kingdom ............. H04B 1/00

OTHER PUBLICATIONS

IEEE Int. Conf. On Consumer Electronics, Jun. 8, 1990, Rosemount, IL, USA, pp. 30–31, Suzuki et al., "Development of a car radio diversity system IC using the noise count system".

*Primary Examiner*—William Cumming
*Attorney, Agent, or Firm*—Joseph S. Tripoli; Peter M. Emanuel; Frank Y. Liao

[57] ABSTRACT

A microcomputer in a radio frequency (RF) signal receiver, such as a cordless telephone set, periodically samples a received baseband audio signal to determine its frequency content. The microcomputer uses at least one predetermined frequency threshold value, and determines that the RF signal is present if the output signal contains signals no higher in frequency the frequency threshold value, and determines that the RF signal is absent if the output signal contains signals higher in frequency than the frequency threshold value. The circuit is useful in either a base unit or a handunit of a cordless telephone set.

8 Claims, 3 Drawing Sheets

MICROCOMPUTER-BASED CARRIER DETECTION SYSTEM FOR A CORDLESS TELEPHONE BY COMPARING AN OUTPUT SIGNAL WHICH CONTAINS SIGNALS NO HIGHER IN FREQUENCY WITH A FREQUENCY THRESHOLD VALUE

This is a continuation of application Ser. No. 08/616,041, filed Mar. 11, 1996 now abandoned, which is a continuation of application Ser. No. 08/171,353, filed Dec. 21, 1993 now abandoned.

FIELD OF THE INVENTION

The subject invention concerns the field of cordless telephones in general, and relates specifically to an apparatus employing a microcomputer for detecting a signal indicative of the presence of an RF carrier.

BACKGROUND OF THE INVENTION

It is common practice for cordless telephone systems to employ analog circuitry to measure the radio frequency (RF) field strength of a carrier on a receive channel, and to provide an indicative signal on a carrier detect output pin. If the signal strength is above a preset threshold level, then a signal of an appropriate logic level is developed at the carrier detect output pin. The carrier detect output pin typically is coupled to an input of a microprocessor, which reads the logic level periodically.

There are several uses for the information gathered from the carrier detect signal. For example, a microprocessor in a base unit can use this information to determine whether the handunit is out-of-range, or not. Alternatively, a microprocessor in either a base unit or a handunit can use this information to determine if a specific channel is occupied.

Unfortunately, during the manufacturing process, an adjustment procedure must be performed on the analog carrier detect circuitry in order to ensure correct triggering at the specified thresholds. This adjustment procedure tends to be difficult, time consuming, and often causes the detection of the RF carrier to be unreliable.

SUMMARY OF THE INVENTION

A radio frequency (RF) signal receiver, includes an input for receiving a radio frequency signal, the radio frequency signal being subject to periods of absence. A signal detector circuit is responsive to the radio frequency signal for producing an output signal, the output signal being a baseband signal when the RF signal is present, or a noise signal when the RF signal is absent. A utilization circuit receives and uses the baseband signal, and a microcomputer circuit controls the receiver.

The microcomputer receives the output signal, and periodically samples said output signal to determine the frequency content of said output signal. The microcomputer uses at least one predetermined frequency threshold value, and determines that the RF signal is present if the output signal has a frequency content no higher than the frequency threshold value, and determines that the RF signal is absent if the output signal has a frequency content higher in frequency than the frequency threshold value.

In an illustrated embodiment, two predetermined frequency threshold values are used, a high frequency threshold and a low frequency threshold. The microcomputer determines the frequency content of the output signal by measuring the pulsewidth of the output signal by periodically sampling it and accumulating a count. The microcomputer determines that an RF signal is present if the output signal has a frequency content no higher than the low frequency threshold value, and determines that an RF signal is absent if the output signal has a frequency content higher in frequency than the high frequency threshold value. The microcomputer also determines RF signal absence when the output signal has a frequency content higher than the low frequency threshold and lower than the high frequency threshold, the determination being made when the count reaches a predetermined value. It should be noted that the high frequency threshold is determined by the sampling rate, but its actual value is not critical, so long as the value is higher than the highest frequency in the speech range.

DETAILED DESCRIPTION OF THE EMBODIMENT

Figure 1A:
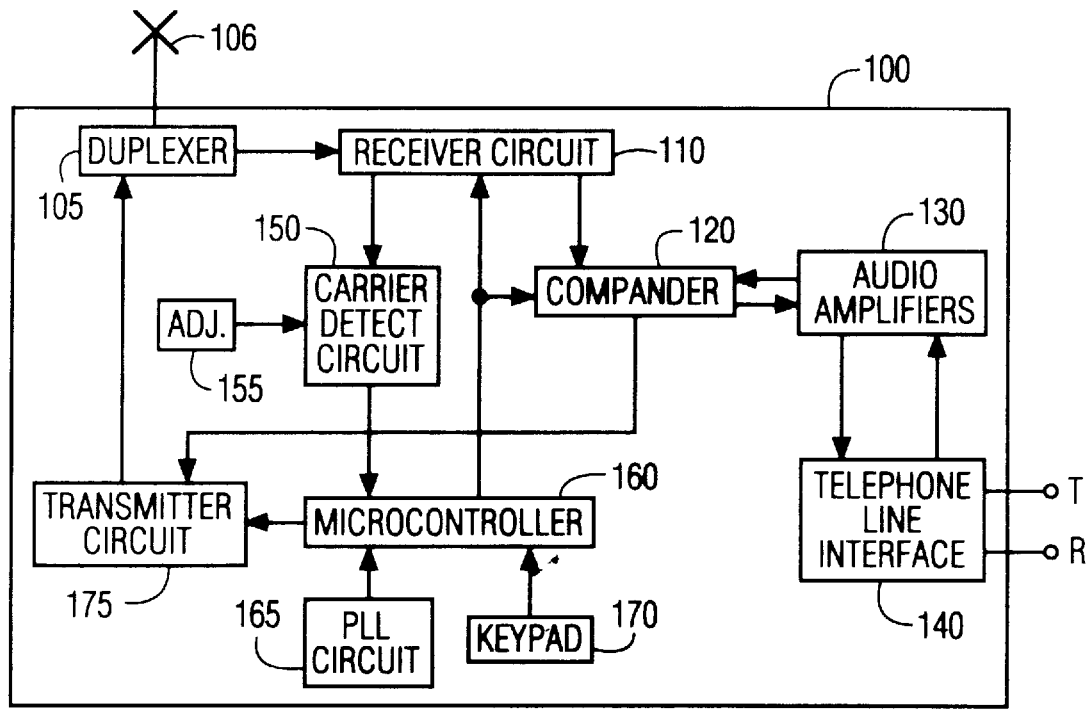
FIG. 1a shows a simplified block diagram of a base unit of a cordless telephone apparatus as known from the prior art.

Referring to FIG. 1a, a cordless telephone 100 as known from the prior art includes a Duplexer 105 for receiving radio frequency (RF) signals from, and applying RF signals to, an antenna 106. Duplexer 105 may be a type DPX 46/49-B10 duplexer manufactured by Soshin Electric Ltd. Signals received from duplexer 105 are applied to a receiver circuit 110 for detection, processing and amplification.

Receiver circuit 110 provides baseband audio signals to a compander 120 for spectral expansion, which in turn applies the audio signals to an audio amplifier 130. Audio amplifier 130 applies amplified audio signals to the tip (T) and ring (R) terminals of a telephone network via a telephone interface unit 140.

Incoming telephone signals are received by telephone interface unit 140 and applied to compander 120 via audio amplifier 130. Compander 120 compresses the amplitude of the audio signals to increase their noise immunity and applies the compressed signals to a transmitter circuit 175. Transmitter 175 modulates the audio signals onto an RF carrier and applies the RF signals to duplexer 105 for transmission via antenna 106.

Interfacing to the telephone network, dialing operations, channel selection and communication with the handunit (not shown) of the cordless telephone apparatus is under control of a microcontroller 160. Microcontroller 160 may be a microprocessor or a microcomputer or a dedicated controller integrated circuit. Microcomputer 100 controls a phase-locked loop (PLL) circuit 165 for frequency selection, and receives data input by user via a keyboard 170.

For certain purposes, such as for providing an out-of-range warning, a detection of RF carrier signals is required. Receiver 110 applies a portion of its received signal to a carrier detect circuit 150, which produces a signal indicative of the presence of an RF carrier. Carrier detect circuit 150 is an analog circuit which measures the RF field strength of the carrier on the receive channel. A carrier detect signal developed by carrier detect circuit 150 is applied to an input of microcontroller 160 which relies on this signal as an indication that a particular channel is not already in use.

Carrier detect circuit 150 has an associated adjustment component 155, usually a potentiometer, which must be adjusted properly during an alignment operation performed in the factory.

Figure 1B:
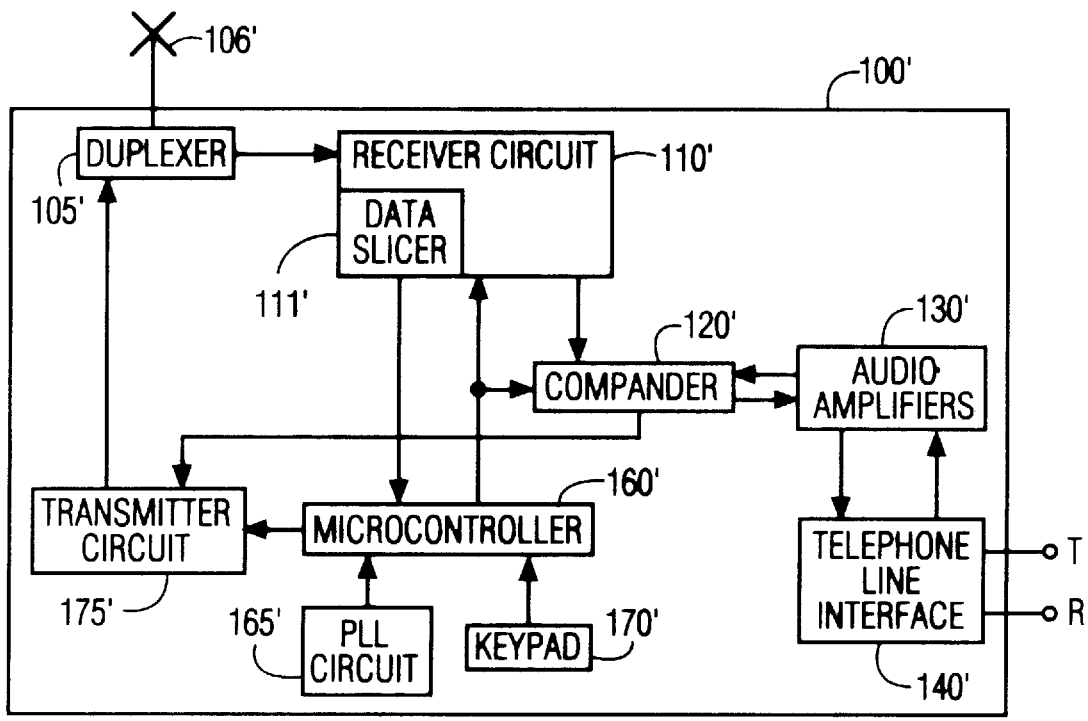
FIG. 1b shows a simplified block diagram of a base unit of a cordless telephone apparatus employing the present invention.

FIG. 1b shows a base unit of a cordless telephone apparatus which incorporates the subject invention. Elements of FIG. 1b bearing similar reference numerals to elements of FIG. 1a serve the same function and need not be explained again. Note that FIG. 1b includes no carrier detect circuit or carrier detect adjustment device, that is FIG. 1b includes no elements corresponding to elements 150 and 155 of FIG. 1a.

Figure 2A:
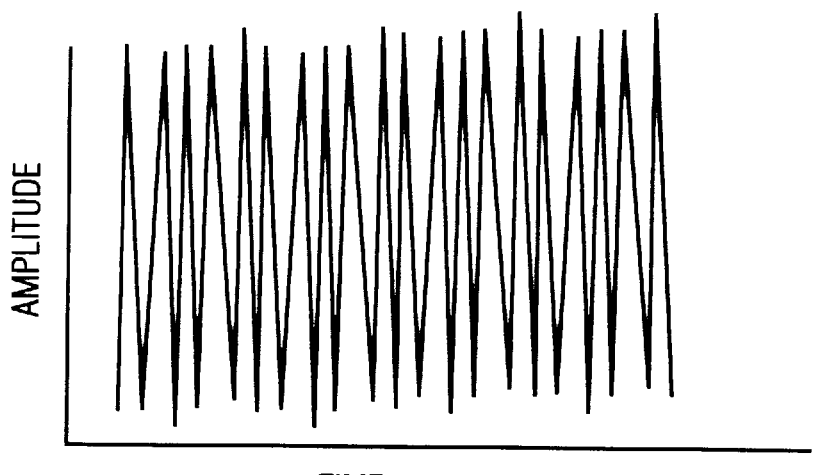
FIGS. 2a–2c show waveforms useful in understanding the invention.
Figure 2B:
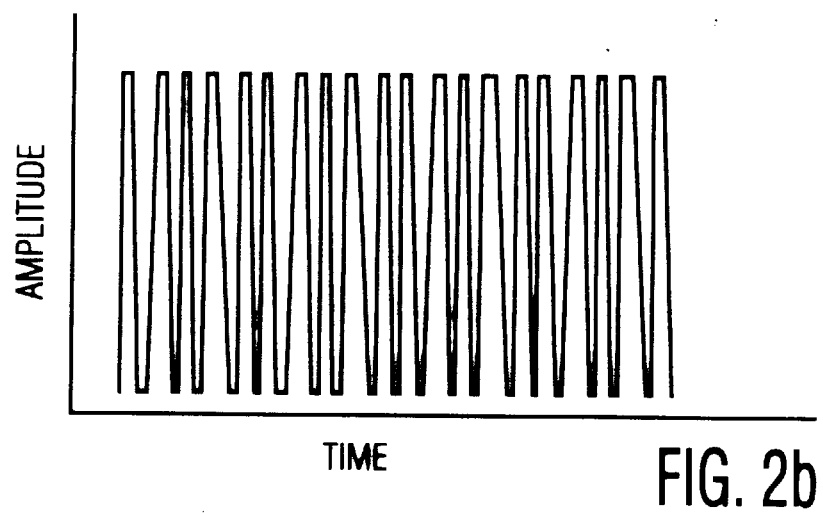

It is herein recognized that the carrier detect function can be performed by microcontroller 160' by causing microcontroller 160' to examine the frequency content of the detected baseband audio signal produced by receiver circuit 110'. Receiver 110' includes a data slicer circuit 111' which receives a portion of the baseband signal and slices it at predetermined amplitude levels to produce a binary signal. Data slicer 111' applies this binary signal directly to microcontroller 160' via a line 115'. FIG. 2a is a simplified illustration of a waveform representing band limited white noise which would be present in the baseband signal received by data slicer 111' in the absence of an RF carrier. Note that the waveform of FIG. 2a contains random noise pulses having frequencies generally higher than the frequency range of speech signals. FIG. 2b is a simplified illustration of the waveform of FIG. 2a after data slicing. The waveform of FIG. 2b is typical of a signal which would be present on line 115' in the absence of an RF carrier.

Figure 2C:
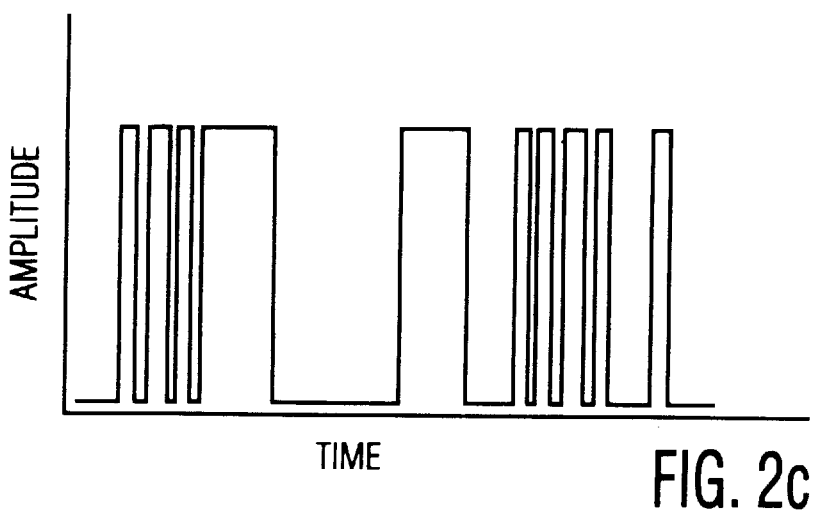

It has been found that human speech tends to exhibit frequencies clustered around 1 kHz with relatively long periods of no signal at all due to silence caused by breaks in the conversation. Thus, the simplified waveform of FIG. 2c illustrates a signal with lower frequency content (i.e., longer pulsewidths) than that of the random noise shown in FIG. 2b. It is herein recognized the microcontroller 110 is capable of sampling the signal on line 115' quickly enough to make a determination of presence or absence of noise, which is indicative of absence or presence of RF carrier, respectively. In this regard, it is noted that microcomputer 110' is interrupted every 118 microseconds for the purpose of generating dual tone multifrequency tones (DTMF tones). Sampling at a 118 microsecond interval enables microcontroller 110' to identify audio frequencies up to approximately 8.5 kHz.

In normal operation microcontroller 160' monitors the baseband signal stream to detect digital data which may accompany the received analog audio signals. The subject invention includes a frequency filtering algorithm which varies the value of a "noise energy" counter in response to the white noise content of the received audio signal. If the count of the noise energy counter exceeds a predetermined value then a determination is made that no carrier exists on the currently selected receiving channel.

Figure 3:
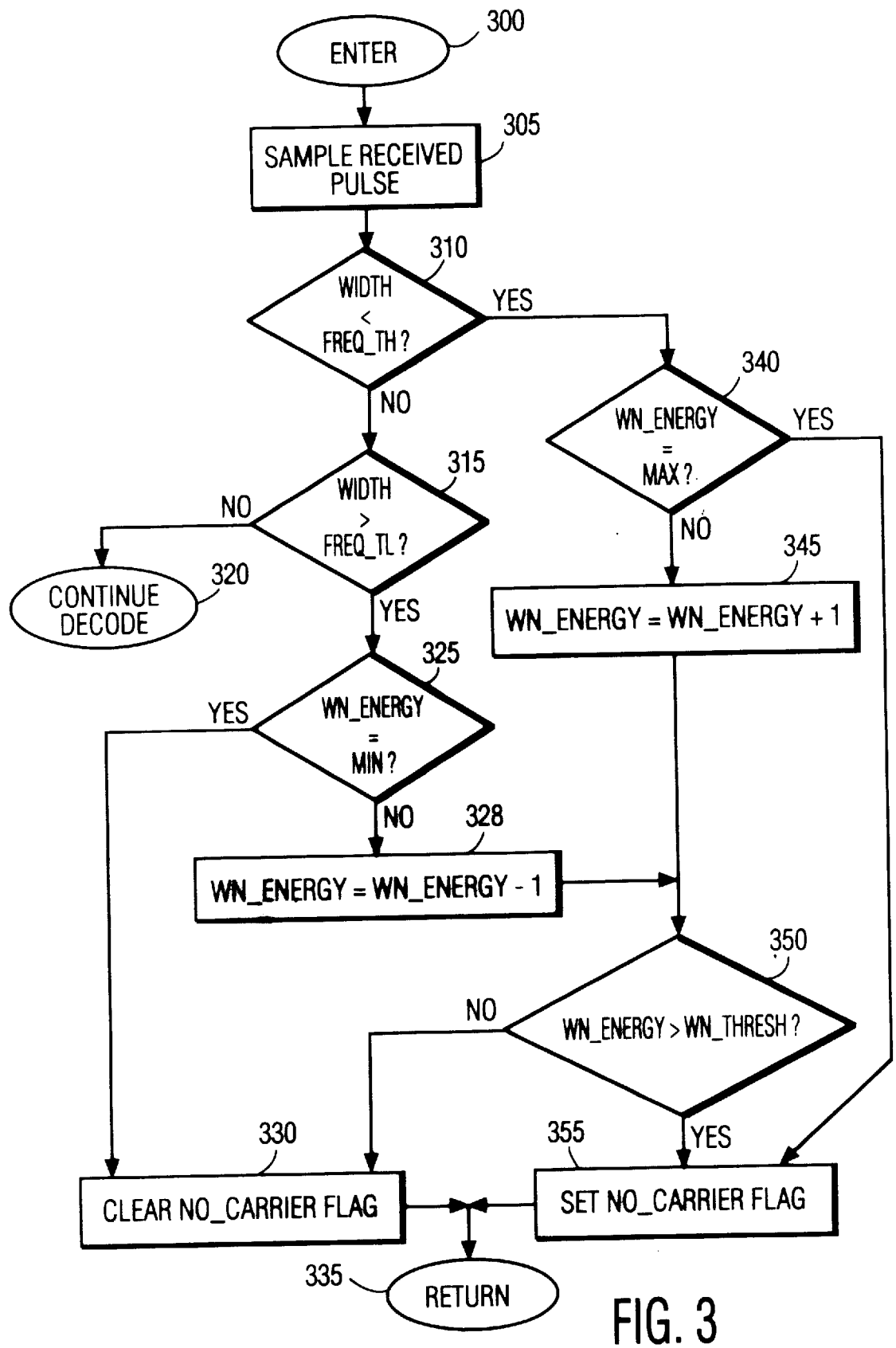
FIG. 3 is an illustration of a flowchart showing the relevant portion of the control program for the microcontroller of FIG. 1b.

The relevant portion of the control program of microcontroller 160' which performs the carrier detection function is best explained by reference to the flowchart of FIG. 3. The routine is entered at step 300, and advances to step 305 at which the audio signal present on line 115' is sampled. The routine then advances to step 310 where the value in a counter WIDTH is checked to see if it is less than a predetermined high frequency threshold, higher than the highest speech frequency. If so, the value in WIDTH is indicative of the detection of high audio frequencies (i.e., white noise). If the count is not indicative of high audio frequency content, then it is checked at step 315 to determine if the pulsewidths detected are indicative of frequencies greater than a predetermined low frequency threshold value, for example 1 kHz (as noted above, human speech tends to be clustered around 1 kHz in frequency). If the frequencies detected are not above 1 kHz, then long pulsewidths (i.e., low audio frequencies) have been detected, a condition which is indicative of speech and/or silence, and routine in exited at step 320 to continue the decoding of the audio signal in the usual manner.

If, on the other hand, the frequency content is not clearly high (i.e., noise) or clearly low (i.e., audio) then the routine advances to step 325 wherein a counter WN_ENERGY (i.e., white noise energy) is checked to see if it equals a minimum value. if so the NO_CARRIER FLAG is cleared (step 330), indicating the presence of an RF carrier, and the routine is exited at step 335. If WN_ENERGY is not at its minimum value it is decremented at step 328, because a longer pulsewidth (i.e., lower frequency has just been detected). The lower value in WN_ENERGY is checked at step 350 to see if it exceeds a predetermined threshold. If so, then a NO_CARRIER FLAG is set at set 355. If not, the NO_CARRIER FLAG is cleared at step 330. In either case the routine is then exited via the RETURN instruction at step 335.

If a determination was made at step 310 that high audio frequencies are present, then the YES path is taken to step 340, wherein content of WN_ENERGY is checked to see if it is at its maximum value. If so, the YES path is taken to step 355 at which the NO_CARRIER FLAG is set, and the routine is exited. If WN_ENERGY is not at its maximum value, it is incremented at step 345, because a high frequency was just detected. The higher value in WN_ENERGY is checked at step 350 to see if it exceeds a predetermined threshold. If so, then the NO_CARRIER FLAG is set at set 355. If not, the NO_CARRIER FLAG is cleared at step 330. In either case the routine is then exited via the RETURN instruction at step 335.

Thus, there has been disclosed, a microcontroller-based carrier detection system useful in, but not limited to, the cordless telephone environment. Although only a base unit is shown for simplicity, the invention is equally applicable to a cordless telephone handunit. Advantageously, through the use of the subject invention, reliability is improved by elimination of the discrete carrier detect circuit and its related adjustment components. Moreover, manufacturing costs are reduced because fewer parts are required, and assembly and testing is simplified.

The terms "microcontroller" and "microcomputer", are used interchangeably herein, and are intended to include microprocessors, microcomputers, dedicated control integrated circuits, and the like.

what is claimed is:

1. A radio frequency (RF) signal receiver, comprising:
an input for receiving a radio frequency signal, said radio frequency signal being subject to periods of absence;
a signal detector circuit coupled to said input responsive to said radio frequency signal for producing an output signal, said output signal being a baseband signal when said RF signal is present, or a noise signal when said RF signal is absent;
a utilization circuit for receiving and using said baseband signal;
a counter; and a microcomputer circuit for controlling said receiver; wherein, said microcomputer periodically sampling said output signal for determining the frequency content of said output signal;

said microcomputer decrementing a count value generated by said counter in response to determining that said output signal contains signals no higher in frequency than a frequency threshold value and incrementing said count value in response to determining that said output signal contains signals higher in frequency than said frequency threshold value; said microcomputer determining that said RF signal is present if said value of said counter is below a predetermined count value: and said microcomputer determining that said RF signal is absent if said value of said counter is above said predetermined count value.

2. The RF receiver of claim 1, wherein said microcomputer utilizes a high frequency threshold and a low frequency threshold and determines the frequency content of said output signal by measuring the pulsewidth of said output signal by periodically sampling said output signal and accumulating a count;

said microcomputer determining that said RF signal is present if said output signal contains signals no higher in frequency said low frequency threshold value, and determines that said RF signal is absent if said output signal contains signals higher in frequency than said high frequency threshold value.

said microcomputer determines RF signal absence when said output signal contains signals which have a frequency higher than said low frequency threshold and lower than said high frequency threshold, said determination being made when said count reaches a predetermined value.

3. A base unit of a cordless telephone set, comprising:

an input for receiving a radio frequency signal from a hand unit of said cordless telephone set, said radio frequency signal being subject to periods of absence;

a signal detector circuit coupled to said input responsive to said radio frequency signal for producing an output signal, said output signal being a baseband signal when said RF signal is present, or a noise signal when said RF signal is absent;

a utilization circuit for receiving and using said baseband signal;

a counter; and a microcomputer circuit for controlling said base unit; wherein, said microcomputer periodically sampling said output signal to determine the frequency content of said output signal;

said microcomputer decrementing a count value generated by said counter in response to determining that said output signal contains signals no higher in frequency than a frequency threshold value and incrementing said count value in response to determining that said output signal contains signals higher in frequency than said frequency threshold value; said microcomputer determining that said RF signal is present if said value of said counter is below a predetermined count value; and said microcomputer determining that said RF signal is absent if said value of said counter is above said predetermined count value.

4. The circuit of claim 3, wherein said microcomputer utilizes a high frequency threshold and a low frequency threshold and determines the frequency content of said output signal by measuring the pulsewidth of said output signal by periodically sampling said output signal and accumulating a count;

said microcomputer determining that said RF signal is present if said output signal contains signals no higher in frequency said low frequency threshold value, and determines that said RF signal is absent if said output signal contains signals higher in frequency than said high frequency threshold value.

said microcomputer determines RF signal absence when said output signal contains signals which have a frequency higher than said low frequency threshold and lower than said high frequency threshold, said determination being made when said count reaches a predetermined value.

5. The circuit of claim 4 wherein said utilization circuit is a telephone interface circuit for coupling telephone signals to a telephone network.

6. The circuit of claim 5 wherein said determination of absence of RF carrier is indicative of an out of range condition.

7. The circuit of claim 5 wherein said determination of absence of RF carrier is indicative of an unoccupied channel.

8. A handunit of a cordless telephone set, comprising:

an input for receiving a radio frequency signal from a base unit of said cordless telephone set, said radio frequency signal being subject to periods of absence;

a signal detector circuit coupled to said input responsive to said radio frequency signal for producing an output signal, said output signal being a baseband signal when said RF signal is present, or a noise signal when said RF signal is absent;

a utilization circuit for receiving and using said baseband signal;

a counter; and a microcomputer circuit for controlling said handunit; wherein, said microcomputer periodically sampling said output signal to determine the frequency content of said output signal;

said microcomputer decrementing a value of said counter in response to determining that said output signal contains signals no higher in frequency than said frequency threshold value and incrementing said value of said counter in response to determining that said output signal contains signals higher in frequency than said frequency threshold value; said microcomputer determining that said RF signal is present if said value of said counter is below a predetermined count value: and said microcomputer determining that said RF signal is absent if said value of said counter is above said predetermined count value.

* * * * *